(12) United States Patent
Ahn et al.

(10) Patent No.: US 8,405,088 B2
(45) Date of Patent: Mar. 26, 2013

(54) THIN FILM TRANSISTOR AND ORGANIC LIGHT EMITTING DIODE DISPLAY DEVICE

(75) Inventors: Ji-Su Ahn, Yongin (KR); Hoon-Kee Min, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 393 days.

(21) Appl. No.: 12/659,550

(22) Filed: Mar. 12, 2010
(Under 37 CFR 1.47)

(65) Prior Publication Data
US 2011/0037074 A1    Feb. 17, 2011

(30) Foreign Application Priority Data
Aug. 13, 2009    (KR) .................. 10-2009-0074816

(51) Int. Cl.
*H01L 51/50*    (2006.01)
*H04N 5/238*    (2006.01)

(52) U.S. Cl. ....... 257/66; 257/72; 257/99; 257/E29.273; 257/E21.619; 257/E51.022; 438/149; 438/151; 438/532

(58) Field of Classification Search .................. 257/59, 257/66, 72, 75, E29.273, E29.277, E29.282, 257/E29.119, E51.018, E51.019, E51.02, 257/E51.022, E21.619; 438/149, 151, 159, 438/161, 517, 532
See application file for complete search history.

(56) References Cited

U.S. PATENT DOCUMENTS

| | | | |
|---|---|---|---|
| 6,515,428 B1 * | 2/2003 | Yeh et al. ............... | 315/169.3 |
| 7,202,501 B2 * | 4/2007 | Kim et al. ............... | 257/72 |
| 7,265,384 B2 * | 9/2007 | Oh .......................... | 257/59 |
| 7,449,397 B2 | 11/2008 | Ro et al. | |
| 7,470,950 B2 * | 12/2008 | Hong et al. ............. | 257/326 |
| 7,642,141 B2 * | 1/2010 | Toyota et al. ........... | 438/154 |
| 2002/0047579 A1 * | 4/2002 | Kunii et al. ............. | 315/169.3 |
| 2005/0098785 A1 * | 5/2005 | You ......................... | 257/72 |
| 2005/0116630 A1 * | 6/2005 | Kim et al. ............... | 313/506 |
| 2006/0160282 A1 * | 7/2006 | Kim et al. ............... | 438/149 |
| 2006/0258070 A1 * | 11/2006 | Han ......................... | 438/167 |
| 2007/0002195 A1 * | 1/2007 | Cho ......................... | 349/43 |
| 2007/0012926 A1 * | 1/2007 | Hong et al. ............. | 257/72 |
| 2007/0080377 A1 * | 4/2007 | Sung et al. ............. | 257/253 |
| 2007/0236141 A1 * | 10/2007 | Lee et al. ................ | 313/506 |
| 2008/0018245 A1 * | 1/2008 | Kim et al. ............... | 313/512 |
| 2008/0048191 A1 * | 2/2008 | Son ......................... | 257/72 |
| 2008/0197356 A1 * | 8/2008 | Kim et al. ............... | 257/71 |
| 2009/0189162 A1 * | 7/2009 | Kim ........................ | 257/72 |
| 2009/0302324 A1 * | 12/2009 | Jiang et al. ............. | 257/72 |
| 2010/0001265 A1 * | 1/2010 | Ahn et al. ............... | 257/40 |
| 2010/0001266 A1 * | 1/2010 | Ahn et al. ............... | 257/40 |

(Continued)

FOREIGN PATENT DOCUMENTS

| | | |
|---|---|---|
| JP | 2002-139744 A | 5/2002 |
| JP | 2009-130229 A | 6/2009 |

(Continued)

*Primary Examiner* — Matthew Landau
*Assistant Examiner* — Maliheh Malek
(74) *Attorney, Agent, or Firm* — Lee & Morse, P.C.

(57) ABSTRACT

A thin film transistor includes a substrate, a buffer layer on the substrate, a semiconductor layer on the buffer layer, source and drain electrodes directly on the semiconductor layer, each of the source and drain electrodes including at least one hole therethrough, a gate insulating layer on the substrate, and a gate electrode on the gate insulating layer and corresponding to the semiconductor layer.

20 Claims, 5 Drawing Sheets

U.S. PATENT DOCUMENTS

| | | | |
|---|---|---|---|
| 2010/0006855 A1* | 1/2010 | Park et al. | 257/72 |
| 2010/0051910 A1* | 3/2010 | Choi | 257/40 |
| 2010/0072483 A1* | 3/2010 | Bae et al. | 257/72 |
| 2010/0117063 A9* | 5/2010 | Kang et al. | 257/40 |
| 2010/0176383 A1* | 7/2010 | Park et al. | 257/40 |
| 2010/0187522 A1* | 7/2010 | Lee et al. | 257/40 |
| 2010/0193779 A1* | 8/2010 | Lee | 257/40 |
| 2010/0200843 A1* | 8/2010 | Arai et al. | 257/40 |
| 2011/0049502 A1* | 3/2011 | Jun et al. | 257/40 |
| 2011/0291096 A1* | 12/2011 | Ryoo et al. | 257/59 |
| 2012/0043548 A1* | 2/2012 | Arai et al. | 257/59 |
| 2012/0097966 A1* | 4/2012 | Ahn et al. | 257/72 |
| 2012/0168750 A1* | 7/2012 | Hayashi et al. | 257/43 |
| 2012/0171823 A1* | 7/2012 | Ahn et al. | 438/166 |
| 2012/0184074 A1* | 7/2012 | Ahn et al. | 438/158 |

FOREIGN PATENT DOCUMENTS

| | | |
|---|---|---|
| KR | 10 2000-0031709 A | 6/2000 |
| KR | 10-2004-0102350 A | 12/2004 |
| KR | 10 2005-0049685 A | 5/2005 |
| KR | 10 2009-0073892 A | 7/2009 |

* cited by examiner

THIN FILM TRANSISTOR AND ORGANIC LIGHT EMITTING DIODE DISPLAY DEVICE

BACKGROUND

1. Field

Example embodiments relate to a thin film transistor and a method of fabricating the same. In particular, example embodiments relate to thin film transistors, methods of fabricating the same by application of an electrical field using metal for source and drain electrodes, and organic light emitting diode display devices having the same.

2. Description of the Related Art

Generally, annealing methods may include a furnace annealing method using a heat furnace, a rapid thermal annealing (RTA) method using radiant heat, e.g., a halogen lamp, and a laser annealing method using laser, and an annealing method using Joule heat. The annealing methods may be determined according to characteristics of the material and process, e.g., a range of an annealing temperature, uniformity of the annealing temperature, a heating rate, a cooling rate, purchase price, and maintenance cost. However, when high temperature annealing or high rate annealing is needed only in a predetermined region of a material due to characteristics of the material and process, a selectable annealing method, e.g., free from processing limitations, may be very limited.

SUMMARY

Embodiments are directed to a thin film transistor, a method of fabricating the same, and an organic light emitting diode display device using the same, which substantially overcome one or more of the problems due to the limitations and disadvantages of the related art.

It is therefore a feature of an embodiment to provide a thin film transistor having a metal electrode directly on a semiconductor layer, thereby preventing occurrence of an arc during crystallization of the semiconductor layer due to effective heat transfer.

It is therefore another feature of an embodiment to provide a thin film transistor with a hole in the source/drain electrode thereof, thereby increasing production yield due to a simplified process.

It is yet another feature of an embodiment to provide a method of fabricating a thin film transistor by application of an electrical field to a metal electrode in direct contact with a semiconductor layer, thereby preventing occurrence of an arc during crystallization of the semiconductor layer due to effective heat transfer.

It is still another feature of an embodiment to provide an organic light emitting diode (OLED) display device having a thin film transistor with one or more of the above features and a method of fabricating the same.

At least one of the above and other features and advantages may be realized by providing a thin film transistor, including a substrate, a buffer layer disposed on the substrate, a semiconductor layer disposed on the buffer layer, source and drain electrodes disposed on the semiconductor layer to be in direct contact with the semiconductor layer, a gate insulating layer disposed on the entire surface of the substrate, and a gate electrode disposed on the gate insulating layer to correspond to the semiconductor layer.

The at least one hole in each of the source and drain electrodes may correspond to a source region and a drain region of the semiconductor layer, respectively. The at least one hole may be through an entire thickness of each of the source and drain electrodes to expose respective source and drain regions of the semiconductor layer. Regions of the semiconductor layer which correspond to the source and drain electrodes may include impurities. The source and drain electrodes may include one or more of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy, and a Cu alloy. The source and drain electrodes may have a thickness of about 50 nm to about 300 nm. Bottom surfaces of the source and drain electrodes may include portions directly on the semiconductor layer, the portions of the bottom surfaces of the source and drain electrodes overlapping entire upper surfaces of the source and drain regions of the semiconductor layer, respectively. Each of the source and drain electrodes may overlap at least two different surfaces of respective source and drain regions of the semiconductor layer.

At least one of the above and other features and advantages may also be realized by providing a method of fabricating a thin film transistor, including forming a buffer layer on a substrate, forming an amorphous silicon layer pattern on the buffer layer, forming a metal layer on the amorphous silicon layer pattern, applying an electric field to the metal layer, such that the amorphous silicon layer pattern is crystallized into a semiconductor layer, patterning the metal layer to form source and drain electrodes directly on the semiconductor layer, such that each of the source and drain electrodes includes at least one hole therethrough, forming a gate insulating layer on the substrate, and forming a gate electrode on the gate insulating layer to correspond to the semiconductor layer.

The method may further include, after forming each of the source and drain electrodes to include at least one hole therethrough, doping the semiconductor layer with impurities through the hole. Applying the electric field may include applying an electrical field of about 100 V/cm$^2$ to about 10000 V/cm$^2$ to the metal layer. Applying the electric field to the metal layer may include uniformly heating the amorphous silicon layer pattern via Joule heating to form a polycrystalline semiconductor layer. Forming the metal layer on the amorphous silicon layer pattern may include forming the metal layer directly on the entire amorphous silicon layer pattern, such that the metal layer overlaps sidewalls and an upper surface of the amorphous silicon layer pattern.

At least one of the above and other features and advantages may also be realized by an OLED display device, including a substrate, a buffer layer disposed on the substrate, a semiconductor layer disposed on the buffer layer, source and drain electrodes disposed on the semiconductor layer to be in direct contact with the semiconductor layer, a gate insulating layer disposed on the entire surface of the substrate, a gate electrode disposed on the gate insulating layer to correspond to the semiconductor layer, an insulating layer disposed on the entire surface of the substrate, and a first electrode electrically connected to one of the source and drain electrodes, an organic layer and a second electrode, which are disposed on the insulating layer. The hole may be on source and drain regions of the semiconductor layer. Regions of the semiconductor layer which correspond to the source and drain electrodes may include impurities. The source and drain electrodes may include one or more of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy, and a Cu alloy.

At least one of the above and other features and advantages may also be realized by providing a method of fabricating an OLED display device, including forming a buffer layer on a substrate, forming an amorphous silicon layer pattern on the buffer layer, forming a metal layer on the amorphous silicon layer pattern, applying an electric field to the metal layer, such that the amorphous silicon layer pattern is crystallized into a semiconductor layer, patterning the metal layer to form source and drain electrodes directly on the semiconductor layer, such that each of the source and drain electrodes includes at least one hole therethrough, forming a gate insulating layer on the substrate, forming a gate electrode on the gate insulating layer to correspond to the semiconductor layer, forming an insulating layer on substrate; and forming a first electrode, an organic layer, and a second electrode sequentially stacked on the insulating layer, the first electrodes being electrically connected to one of the source and drain electrodes.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0074816, filed on Aug. 13, 2009, in the Korean Intellectual Property Office, and entitled: "Thin Film Transistor, Method of Fabricating the Same, and Organic Light Emitting Diode Display Device Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 1A:
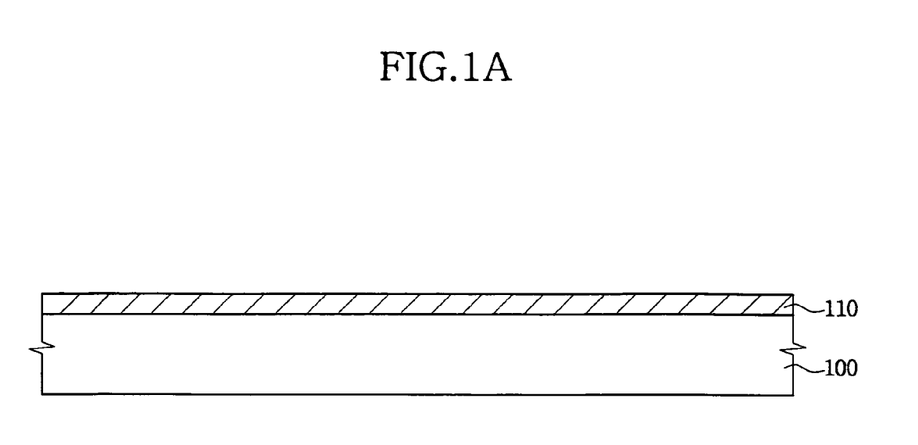
FIGS. 1A through 1I illustrate views of a thin film transistor according to an exemplary embodiment.
Figure 1B:
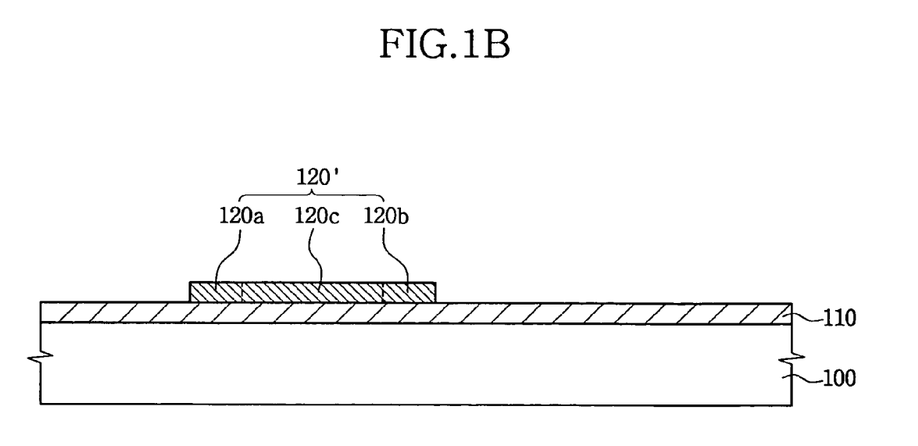
Figure 1C:
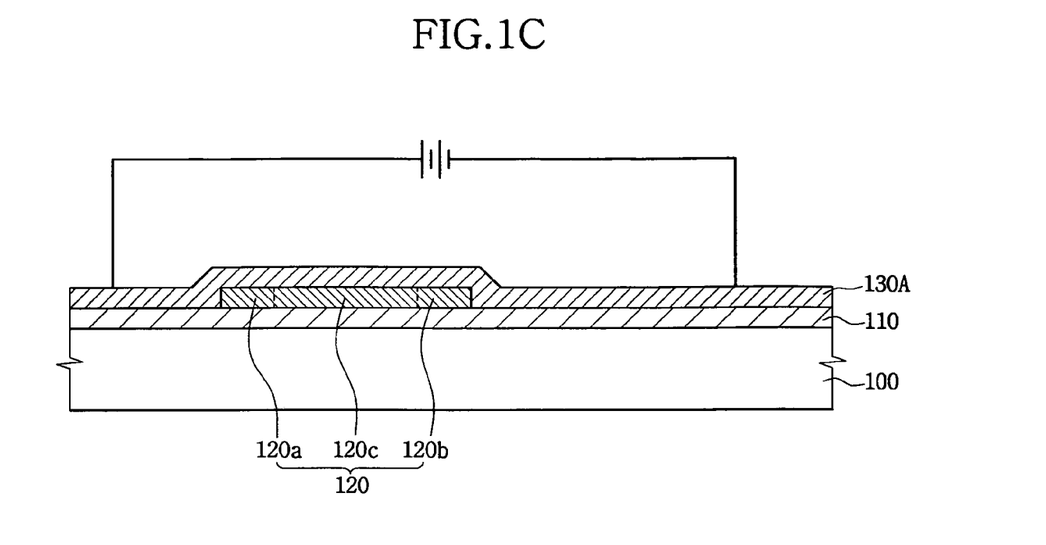
Figure 1D:
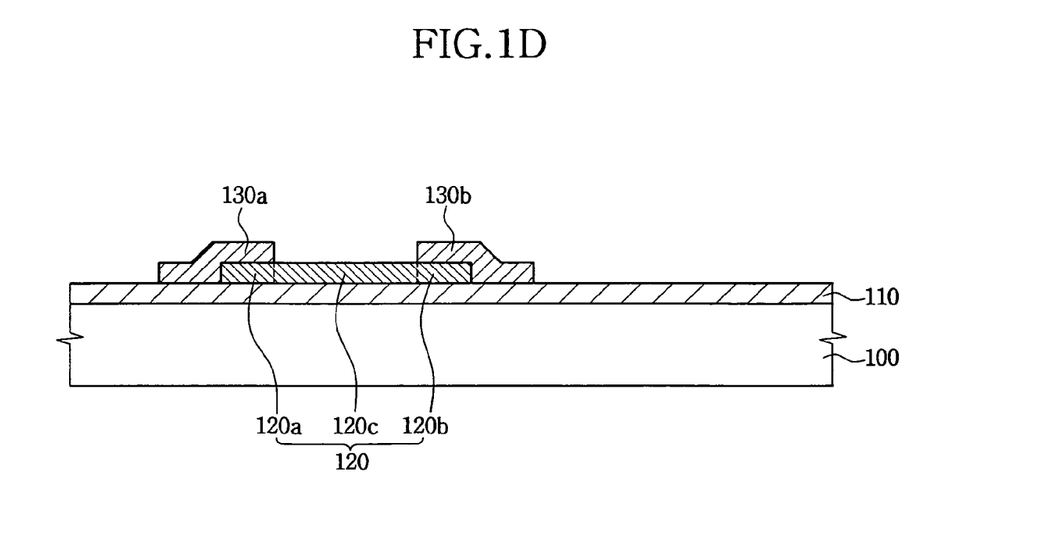
Figure 1E:
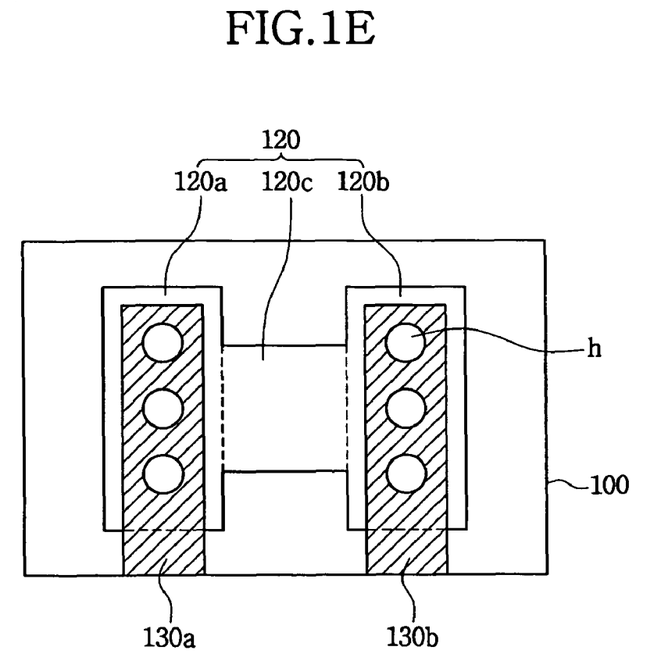
Figure 1F:
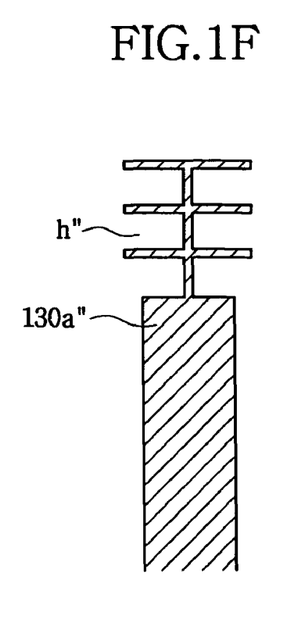
Figure 1G:
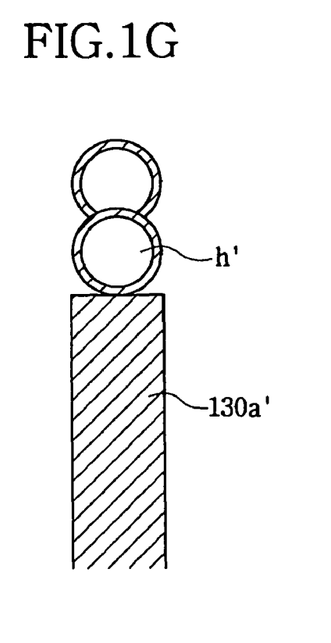

FIGS. 1A through 1I illustrate views of a thin film transistor according to an exemplary embodiment. In particular, FIGS. 1A-1D, 1H, and 1I illustrate cross-sectional views of stages in a method of manufacturing the thin film transistor, FIG. 1E illustrates a plan view of the structure in FIG. 1D, and FIGS. 1F and 1G illustrate other exemplary embodiments of patterns of source/drain electrodes.

Referring to FIG. 1A, a substrate 100 may be prepared, and a buffer layer 110 may be formed on the substrate 100. The substrate 100 may be formed, e.g., of glass or plastic. The buffer layer 110 may prevent diffusion of moisture or impurities from the substrate 100, and/or may control a heat transfer rate during subsequent crystallization to facilitate the crystallization of an amorphous silicon layer. The buffer layer 110 may be formed of an insulating layer, e.g., a silicon oxide layer, a silicon nitride layer, or a combination thereof.

Next, referring to FIG. 1B, an amorphous silicon layer pattern 120' may be formed on, e.g., directly on, the buffer layer 110. For example, the amorphous silicon layer pattern 120' may be selectively formed in a predetermined portion of the buffer layer 110.

Subsequently, referring to FIG. 1C, a metal layer 130A for source and drain electrodes may be formed on the entire surface of the substrate 100. For example, the metal layer 130A may overlap the entire buffer layer 110, so one portion of the metal layer 130A may be directly on the buffer layer 110 and another portion of the metal layer 130A may be formed, e.g., conformally, directly on the amorphous silicon layer pattern 120'. For example, the metal layer 130A may, e.g., uniformly, overlap three surfaces of the amorphous silicon layer pattern 120', so the amorphous silicon layer pattern 120' may be enclosed, e.g., completely enclosed, between the metal layer 130A and the buffer layer 110.

The metal layer 130A may be formed of metal. For example, the metal layer 130A may be formed of one or more of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy, and a Cu alloy.

The metal layer 130A may have a substantially uniform thickness suitable for forming source and drain electrodes 130a and 130b. For example, the metal layer 130A may be formed to a thickness of about 50 nm to about 300 nm. When the thickness of the metal layer 130A is less than about 50 nm, the metal layer 130A may not be uniformly formed, and thus, subsequent crystallization of an underlying layer, i.e., the amorphous silicon layer pattern 120', may be non-uniform due to non-uniform heat transfer through the non-uniform thickness of the metal layer 130A. When the thickness of the metal layer 130A is more than about 300 nm, patterning of the metal layer 130A to form the source and drain electrodes 130a and 130b may be difficult.

Next, as further illustrated in FIG. 1C, an electric field may be applied to the metal layer 130A, e.g., immediately after formation of the metal layer 130A. Application of the electric field to the metal layer 130A may generate heat, which is transferred to the amorphous silicon layer pattern 120' under the metal layer 130A. In other words, since the metal layer 130A has a substantially uniform thickness directly on the entire amorphous silicon layer pattern 120', application of the electric field to the metal layer 130A may provide rapid and substantially uniform heat transfer to the amorphous silicon layer pattern 120', thereby substantially uniformly crystallizing the amorphous silicon layer pattern 120' into a semiconductor layer 120.

The applied electric field may be of about 100 V/cm$^2$ to about 10000 V/cm$^2$, and may be applied for about 1 μs to about 1 s. When the electrical field is less than about 100 V/cm$^2$, insufficient Joule heat may be generated for crystallization. When the electrical field is more than about 10000 V/cm$^2$, an arc may be generated in a resultant semiconductor layer during the Joule heat, thereby causing physical defects in the resultant semiconductor layer. Further, when the electrical field is applied for less than about 1 μs, insufficient Joule heat may be generated for crystallization. When the electrical field is applied for more than about 1 s, the substrate may be bent or have defects at an edge thereof due to heat transfer during crystallization, thereby reducing stability, operability, and reliability of the thin film transistor.

Afterwards, referring to FIG. 1D, the metal layer 130A may be patterned, thereby forming the source and drain electrodes 130a and 130b on the semiconductor layer 120. The semiconductor layer 120 may include source and drain regions 120a and 120b, and a channel region 120c therebetween. The source and drain electrodes 130a and 130b may be patterned to correspond to the source and drain regions 120a and 120b, respectively, of the semiconductor layer 120. For example, one portion of the source electrode 130a may be formed on, e.g., directly on, the source region 120a of the semiconductor layer 120 and another portion of the source electrode 130a may be formed on, e.g., directly on, the buffer layer 110. For example, bottom surfaces of the source and drain electrodes 130a_1 and 130b_1 may include portions directly on the semiconductor layer, the portions of the bottom surfaces of the source and drain electrodes overlapping entire upper surfaces of the source and drain regions 120a and 120b of the semiconductor layer 120, respectively. For example, the source electrode 130a may overlap a sidewall and an upper surface of the source region 120a of the semiconductor layer 120. It is noted that while the source electrode 130a was described, the structure of the drain electrode 130b with respect to the drain region 120b of the semiconductor layer 120 is the same as that of the source electrode 130a with respect to the source region 120a of the semiconductor layer 120.

During patterning of the source and drain electrodes 130a and 130b, as illustrated in FIG. 1E, at least one hole h may be formed therein to correspond to the source and drain regions 120a and 120b of the semiconductor layer 120. In particular, referring to FIGS. 1D and 1E, the source and drain electrodes 130a and 130b may be patterned to be spaced apart from each other along a first direction, and may correspond to the source and drain regions 120a and 120b of the semiconductor layer 120, respectively. For example, each of the source and drain electrodes 130a and 130b may include at least one hole h therethrough to expose the source and drain regions 120a and 120b, respectively. The hole h may be formed to inject impurities into the semiconductor layer 120 in a subsequent process. A position or shape of the hole h may be adjusted to control an impurity doping concentration in the semiconductor layer 120.

The hole h may be formed along with the source and drain electrodes 130a and 130b by patterning. For example, as illustrated in FIG. 1E, a plurality of holes h may be formed along a second direction, i.e., a direction substantially perpendicular to the first direction, in each of the source and drain electrodes 130a and 130b. For example, as illustrated in FIG. 1E, the plurality of holes h may be arranged along a majority of a length of each of the source and drain electrodes 130a and 130b, and may have closed circular shapes. In another example, as illustrated in FIG. 1G, only a portion of the source electrode 130a' may be patterned to form holes h,' and another portion of the source electrode 130a' may remain solid. In yet another example, as illustrated in FIG. 1F, a portion of the source electrode 130a" may be patterned to form open-shaped holes h", e.g., an open grid shape, while another portion of the source electrode 130a" may remain solid. It is noted that FIGS. 1E-1G illustrate merely exemplary shapes of patterns of the source and drain electrodes 130a and 130b. Therefore, other shapes and patterns of holes in drain/source electrodes capable of facilitating injection of impurities therethrough, e.g., polygonal or linear structure of holes, are within the scope of the present invention.

Subsequently, referring back to FIGS. 1D and 1E, when formation of the hole h through the source and drain electrodes 130a and 130b is complete, the source and drain regions 120a and 120b of the semiconductor layer 120 may be doped with impurities through the holes h. The impurities may be of a N-type or a P-type. The channel region 120c between the source and drain regions 120a and 120b may not be doped.

Figure 1H:
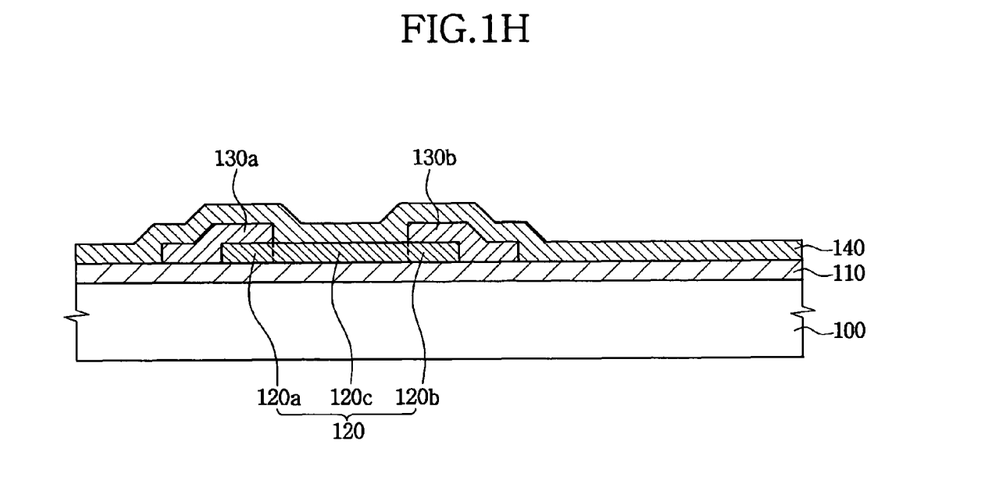

Next, referring to FIG. 1H, a gate insulating layer 140 may be formed on the entire surface of the substrate 100. For example, the gate insulating layer 140 may be on portions of the buffer layer 110, source/drain electrodes 130a and 130b, and the channel region 120c. The gate insulating layer 140 may be, e.g., a silicon oxide layer, a silicon nitride layer, or a combination thereof.

Figure 1I:
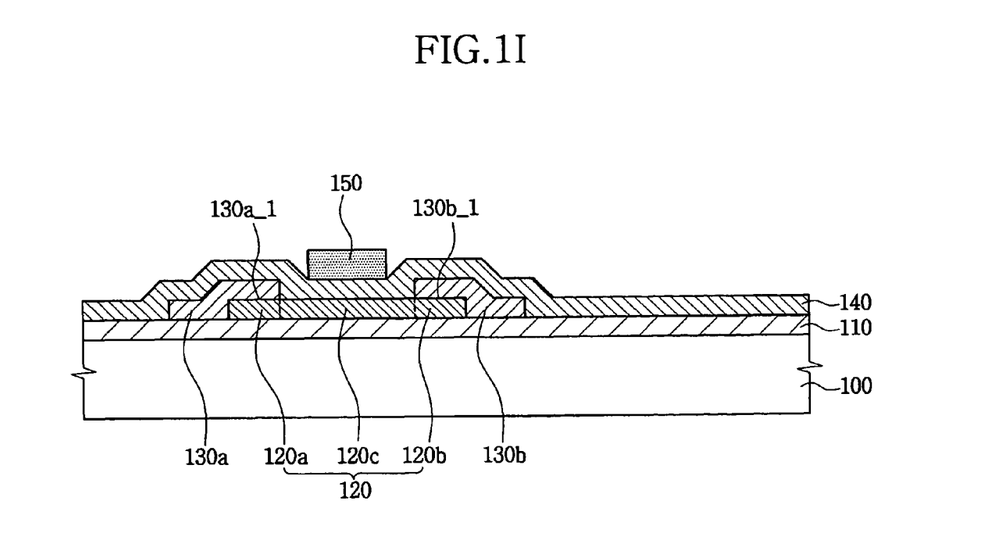

Referring to FIG. 1I, a gate electrode 150 may be formed on the gate insulating layer 140 to correspond to the semiconductor layer 120. For example, the gate electrode 150 may be formed on the channel region 120c of the semiconductor layer 120 not to overlap the source and drain electrodes 130a and 130b. The gate electrode 150 may be formed in a single layer structure, e.g., an Al layer or an Al alloy layer such as an Al—Nd layer, or in a multi-layer structure, e.g., an Al alloy layer stacked on a Cr or Mo alloy layer. It is noted that FIG. 1I illustrates an exemplary thin film transistor according to an embodiment.

Figure 2A:
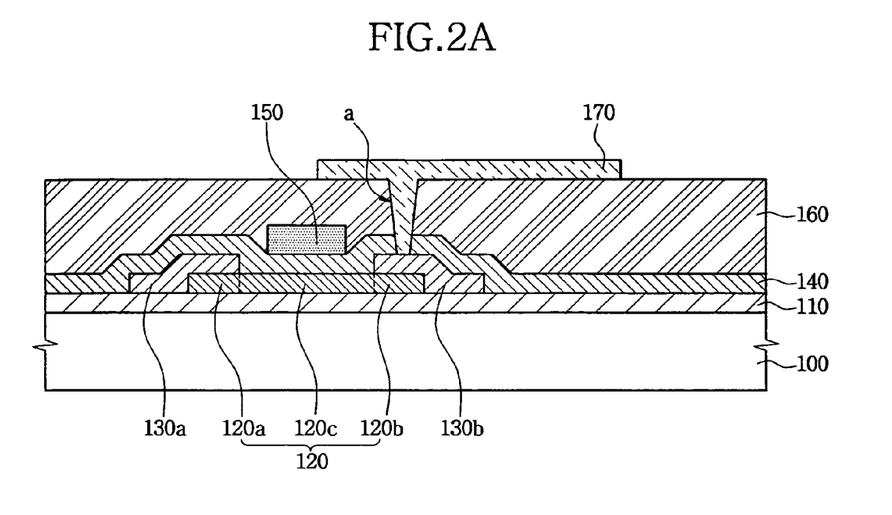
FIGS. 2A and 2B illustrate cross-sectional views of stages in a method of fabricating an OLED display device according to an exemplary embodiment.
Figure 2B:
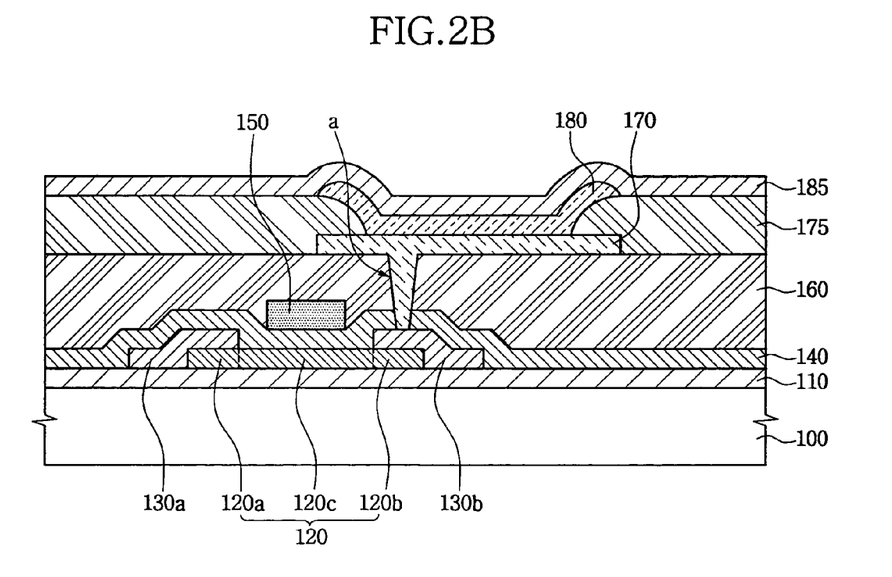

FIGS. 2A and 2B illustrate an OLED display device having a thin film transistor according to an exemplary embodiment. In FIGS. 2A and 2B, the OLED display device includes the thin film transistor described previously in FIGS. 1A-1I.

Referring to FIG. 2A, a thin film transistor may be formed as described previously with reference to FIGS. 1A-1I. Next, an insulating layer 160 may be formed on the entire surface of the substrate 100 to cover the thin film transistor. The insulating layer 160 may include at least one layer, e.g., including a protective layer and/or a planarization layer. The insulating layer 160 may be an inorganic layer, e.g., one or more of silicon oxide, silicon nitride, silicate on glass, etc., and/or an organic layer, e.g., one or more of polyimide, benzocyclobutene-based resin, and acrylate. The insulating layer 160 may be formed in a stacked structure of the inorganic layer and the organic layer.

The gate insulating layer 140 and the insulating layer 160 may be etched to form a via hole a therethrough to partially expose one of the source and drain electrodes 130a and 130b. A first electrode 170 connected to one of the source and drain electrodes 130a and 130b through the via hole a may be formed. The first electrode 170 may be an anode or a cathode. When the first electrode 170 is an anode, the anode may be formed of a transparent conductive layer formed of one of ITO, IZO and ITZO, and when the first electrode 170 is a cathode, the cathode may be formed of Mg, Ca, Al, Ag, Ba, or an alloy thereof.

Subsequently, referring to FIG. 2B, a pixel defining layer 175 having an opening partially exposing a surface of the first electrode 170 may be formed on the first electrode 170, and an organic layer 180 having an emission layer may be formed on the exposed first electrode 170. The organic layer 180 may further have at least one selected from a hole injection layer, a hole transport layer, a hole blocking layer, an electron blocking layer, an electron injection layer, and an electron transport layer. Then, a second electrode 185 may be formed on the organic layer 180. Thus, an OLED display device according to the exemplary embodiment may be completed.

A thin film transistor according to exemplary embodiments may include a metal electrode layer directly on an amorphous silicon layer, so when the amorphous silicon layer is crystallized into a polycrystalline silicon layer by applying an electrical field to the metal electrode layer, i.e., a layer to later become source and drain electrodes, occurrence of an arc in the polycrystalline silicon layer may be prevented or substantially minimized. In particular, since the metal layer is directly formed on the amorphous silicon layer, efficiency of heat transfer during application of the electric field may be increased, so crystallization may be uniformly and effectively performed without defects, e.g., without occurrence of an arc, thereby improving production yield. In addition, the source and drain electrodes may be continuously patterned with at least one hole therethrough, so the semiconductor layer may be doped with impurities through the hole, thereby providing a simple process.

In contrast, a conventional crystallization of an amorphous silicon, e.g., a laser annealing method, may require expensive equipment and high maintenance costs, and may apply only to a limited set of materials. In particular, since scanned linear laser beams may overlap to anneal a large-sized device, non-uniformity in intensity of the laser beam and non-uniformity in irradiation level of the laser beam with respect to time may occur. In another example of a conventional crystallization of an amorphous silicon, e.g., a RTA annealing method, the annealing method may be applied only to a 300 mm silicon wafer, so larger substrates may be non-uniformly annealed. Moreover, the RTA method may have a maximum heating rate of about 400° C./sec, and thus, cannot be applied to a process requiring a higher heating rate.

Therefore, formation of the thin film transistor according to example embodiments may include applying an electrical field to a metal layer and generating Joule heat that can rapidly and uniformly anneal a selected material by transfer of high heat, and may have a much higher heating rate than, e.g., the conventional RTA method. Such formation method may prevent or substantially minimize occurrence of an arc during crystallization due to the Joule heat generated by application of the electrical field using the metal for source and drain electrodes directly on the amorphous silicon, so crystallization uniformity may increase, defects of the device may be minimized, and production yield may be increased.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A thin film transistor, comprising:
   a substrate;
   a buffer layer on the substrate;
   a semiconductor layer on the buffer layer;
   source and drain electrodes directly on the semiconductor layer, each of the source and drain electrodes including at least one hole therethrough;
   a gate insulating layer on the substrate; and
   a gate electrode on the gate insulating layer and corresponding to the semiconductor layer.

2. The thin film transistor as claimed in claim 1, wherein the at least one hole in each of the source and drain electrodes corresponds to a source region and a drain region of the semiconductor layer, respectively.

3. The thin film transistor as claimed in claim 2, wherein the at least one hole is through an entire thickness of each of the source and drain electrodes to expose respective source and drain regions of the semiconductor layer.

4. The thin film transistor as claimed in claim 1, wherein regions of the semiconductor layer which correspond to the source and drain electrodes include impurities.

5. The thin film transistor as claimed in claim 1, wherein the source and drain electrodes include one or more of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy, and a Cu alloy.

6. The method as claimed in claim 1, wherein the source and drain electrodes have a thickness of about 50 nm to about 300 nm.

7. The method as claimed in claim 1, wherein bottom surfaces of the source and drain electrodes include portions directly on the semiconductor, the portions of the bottom surfaces of the source and drain electrodes overlapping entire upper surfaces of the source and drain regions of the semiconductor layer, respectively.

8. The method as claimed in claim 1, wherein each of the source and drain electrodes overlaps at least two different surfaces of respective source and drain regions of the semiconductor layer.

9. A method of fabricating a thin film transistor, comprising:
   forming a buffer layer on a substrate;
   forming an amorphous silicon layer pattern on the buffer layer;
   forming a metal layer on the amorphous silicon layer pattern;
   applying an electric field to the metal layer, such that the amorphous silicon layer pattern is crystallized into a semiconductor layer;
   patterning the metal layer to form source and drain electrodes directly on the semiconductor layer, such that each of the source and drain electrodes includes at least one hole therethrough;
   forming a gate insulating layer on the substrate; and
   forming a gate electrode on the gate insulating layer to correspond to the semiconductor layer.

10. The method as claimed in claim 9, further comprising, after forming each of the source and drain electrodes to include at least one hole therethrough, doping the semiconductor layer with impurities through the holes.

11. The method as claimed in claim 9, wherein applying the electric field includes applying an electrical field of about 100 V/cm$^2$ to about 10000 V/cm$^2$ to the metal layer.

12. The method as claimed in claim 9, wherein applying the electric field to the metal layer includes uniformly heating the amorphous silicon layer pattern via Joule heating to form a polycrystalline semiconductor layer.

13. The method as claimed in claim 9, wherein forming the metal layer on the amorphous silicon layer pattern includes forming the metal layer directly on the entire amorphous silicon layer pattern, such that the metal layer overlaps sidewalls and an upper surface of the amorphous silicon layer pattern.

14. An organic light emitting diode (OLED) display device, comprising:
   a substrate;
   a buffer layer on the substrate;
   a semiconductor layer on the buffer layer;
   source and drain electrodes directly on the semiconductor layer, each of the source and drain electrodes including at least one hole therethrough;
   a gate insulating layer on the substrate;
   a gate electrode on the gate insulating layer and corresponding to the semiconductor layer;
   an insulating layer on the substrate; and
   a first electrode, an organic layer, and a second electrode sequentially stacked on the insulating layer, the first electrodes being electrically connected to one of the source and drain electrodes.

15. The device as claimed in claim 14, wherein the hole are on source and drain regions of the semiconductor layer.

16. The device as claimed in claim 14, wherein regions of the semiconductor layer which correspond to the source and drain electrodes include impurities.

17. The device as claimed in claim 14, wherein the source and drain electrodes include one or more of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy, and a Cu alloy.

18. A method of fabricating an organic light emitting diode (OLED) display device, comprising:
   forming a buffer layer on a substrate;
   forming an amorphous silicon layer pattern on the buffer layer;
   forming a metal layer on the amorphous silicon layer pattern;
   applying an electric field to the metal layer, such that the amorphous silicon layer pattern is crystallized into a semiconductor layer;
   patterning the metal layer to form source and drain electrodes directly on the semiconductor layer, such that each of the source and drain electrodes includes at least one hole therethrough;
   forming a gate insulating layer on the substrate; and
   forming a gate electrode on the gate insulating layer to correspond to the semiconductor layer;
   forming an insulating layer on substrate; and
   forming a first electrode, an organic layer, and a second electrode sequentially stacked on the insulating layer, the first electrodes being electrically connected to one of the source and drain electrodes.

19. The method as claimed in claim 18, further comprising doping the semiconductor layer with impurities through the hole, the hole being formed on source and drain regions of the semiconductor layer.

20. The method as claimed in claim 18, wherein applying the electric field includes applying an electrical field of about 100 V/cm$^2$ to about 10000 V/cm$^2$ to the metal layer.

* * * * *